United States Patent [19]

Kojima et al.

[11] Patent Number: 4,950,866
[45] Date of Patent: Aug. 21, 1990

[54] METHOD AND APPARATUS OF BONDING INSULATED AND COATED WIRE

[75] Inventors: Toosaku Kojima, Yokohama; Tsutomu Mimata, Akikawa; Susumu Okikawa, Oume; Michio Okamoto, Machida; Takeshi Kawana; Satoshi Urayama, both of Yokohama, all of Japan

[73] Assignee: Hitachi, Ltd., Tokyo, Japan

[21] Appl. No.: 277,645

[22] Filed: Nov. 29, 1988

[30] Foreign Application Priority Data

Dec. 8, 1987 [JP] Japan .................................. 62-308540
Apr. 15, 1988 [JP] Japan .................................. 63-91404

[51] Int. Cl.$^5$ .............................................. B23K 9/00
[52] U.S. Cl. ............................ 219/137 PS; 219/56.22; 228/110
[58] Field of Search ............ 219/56.21, 56.22, 137 PS; 228/1 R, 110

[56] References Cited

U.S. PATENT DOCUMENTS 4,171,477 10/1979 Funari .
4,489,231 12/1984 Luetzow .......................... 219/56.22

OTHER PUBLICATIONS

Welding Technology, Mar., 1983, pp. 23-27.

Primary Examiner—Clifford C. Shaw
Attorney, Agent, or Firm—Fay, Sharpe, Beall, Fagan, Minnich & McKee

[57] ABSTRACT

A method of bonding an insulated and coated wire which has an insulated coating on the outside of an electrically conductive wire is disclosed which consists in connecting one end of said insulated and coated wire to the anode side of an arc power source and connecting a discharge torch to the cathode side of said arc power source with an arc discharge performed between the tip of said insulated and coated wire and the discharge torch to form a ball at said end, and said ball being positioned with respect to the bonding pad of an electrically conductive electrode and bonding being performed with a specified pressure applied to said ball.

4 Claims, 6 Drawing Sheets

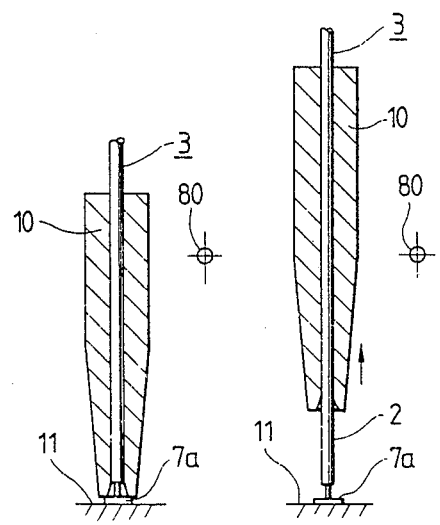
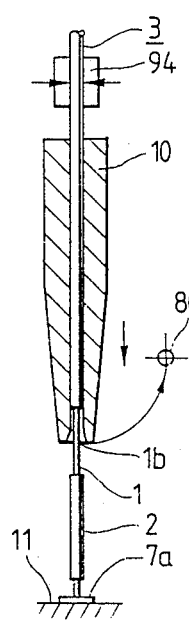
FIG. 17(a) FIG. 17(b) FIG. 17(c) FIG. 17(d)
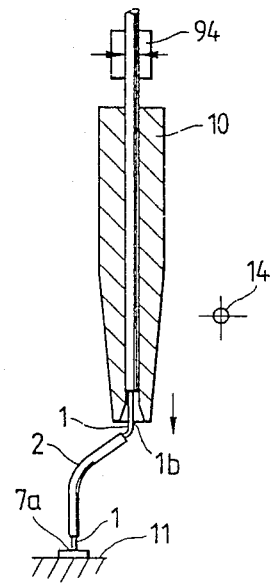
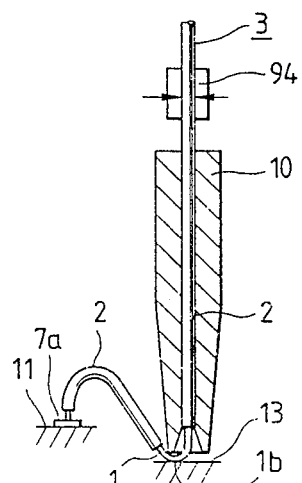
FIG. 17(e) FIG. 17(f)

METHOD AND APPARATUS OF BONDING INSULATED AND COATED WIRE

BACKGROUND OF THE INVENTION

1. Field of Invention

This invention relates to the method and apparatus for wire-bonding an insulated and coated wire, and in particular to the method and apparatus for wire-bonding an electrically conductive wire of an insulated and coated wire, in the wiring of a semiconductor device or printed circuit board where an insulated and coated wire is used, to an electrically conductive electrode.

2. Description of the Prior Art

Conventionally, when an insulated and coated wire is connected to an electrode in a circuit board of a semiconductor device, the electrode is beforehand plated with solder metal as described in 'Welding Technology' (March 1983, PP. 23-27), and an insulated and coated wire is placed on the electrode. Then a heated capillary is used to melt the solder on the electrode. With this melting, the wire is connected to the electrode by the so-called reflow soldering method. If in this case the insulated and coated wire uses polyurethane as a material of the insulated coating, the solder metal on the electrode is transferred to the electrically conductive wire material and the connection is readily achieved because the polyurethane melts at about 300° C.

In the case of connecting an insulated and coated wire to an electrically conductive electrode which is made of gold, silver, aluminum, copper, etc. or an electrode which consist of a plating of an alumina ceramics, a tungsten layer, then a nickel layer on the tungsten layer, and further gold, aluminum, etc. on the nickel layer as in the internal wiring of a semi-conductor device, the temperature to which a capillary is heated is further raised to melt the metal on the top surface of the electrode and the connection between an insulated and coated wire and electrode can be carried out in the same manner.

In the prior art as described above in which an insulated and coated wire is connected to an electrically conductive electrode, a portion of the insulated coating which does not come in direct contact with the capillary which is heated to a high temperature and is not involved in the connection is melted to expose an excessive length of the electrically conductive wire material. This exposed wire material may cause shortcircuiting by its contact with another exposed wire material or a leakage current by its contact with the surface of an electrode, and the molten insulated coating may be attached to an electrically conductive electrode and obstruct the connection between the electrode and the insulated and coated wire. Consideration has not been given in the prior art to the problems of the inconveniences due to the above mentioned troubles.

SUMMARY OF THE INVENTION

It is, therefore, an object of the present invention to provide a method of wire-bonding an insulated and coated wire to an electrically conductive electrode in which there is no trouble such as leakage of electric current from the insulated and coated wire to the surface of an electrode, shortcircuiting among insulated and coated wires, and the obstruction of the connection by the melted insulated coating.

Another object of the invention is to provide a method and apparatus for wire-bonding an insulated and coated wire to an electrode by utilizing effectively without loss the wire material of the insulated and coated wire.

A further object of the invention is to provide a method and apparatus for wire-bonding an insulated and coated wire in which the connection by contact bonding between the surface of an electrode and the coated wire is effected efficiently and surely.

Accordingly in the present invention the electrically conductive wire material of an insulated and coated wire is connected to the anode side of an arc power source and a discharge torch to its cathode side, and in the environment of an inert gas arc discharge is triggered between the wire material and discharge torch to form a ball on the end tip of said insulated and coated wire. Then this ball is positioned with respect to a first bonding pad to perform a first bonding.

Additionally the hot air blown out of a hot air nozzle which is for blowing hot air to a coating to remove it is used to remove the coating at the connecting section of a second bonding and its peripheral portions, and with ultrasonic waves being applied to the connecting section of the second bonding, which is stripped of its coating, pressure is added to this connection section to give a second bonding to the second bonding pad.

Further, an insulated and coated wire is wound on a metal spool which is freely rotatable and the electrically conductive wire material at the end of the insulated and coated wire is connected to this metal spool. The above-mentioned arc power source is constructed so as to apply voltage which drops in proportion to the winding length of the insulated and coated wire which is left on the metal spool. The anode side of this arc power source is connected to the metal spool in rotation with the metal spool grounded, and the cathode side is connected to a discharge torch.

BRIEF DESCRIPTION OF THE DRAWINGS

FIG. 17(a)-FIG. 17(f) are work process diagrams of the bonding in the embodiment in FIG. 15.

DESCRIPTION OF THE PREFERRED EMBODIMENTS

Firstly the basic matters regarding the present invention will be explained with reference to FIGS. 1-4.

In a first bonding, the tip end of an insulated and coated wire is inserted withdrawably into the throughhole of a capillary and positioned with respect to the first bonding pad of an electrically conductive electrode by said capillary. Then, the tip is connected to the bonding pad. The electrically conductive material at the tip is, according to the present invention, melted to form a ball of the electrically conductive material by its surface tension (the details of the ball making given below), and except for the section of the ball, the insulated coating does not melt. There is no melting that occurs upwards from the ball so that the electrically conductive material is covered by the insulated coating. After the ball is positioned with respect to the first bonding pad by the capillary, the ball is connected to the bonding pad with a specified pressure applied to the ball and with an applied ultrasonic vibration.

Figure 1:
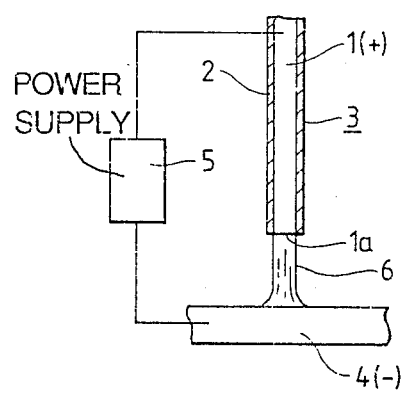
FIG. 1 is a schematic view of showing the method of forming a ball in the first bonding.

The method of forming the ball will be explained in FIG. 1. An insulated and coated wire 3 consists of an insulated coating 2 that coats the outside of an electrically conductive material 1.

A discharge torch 4 is connected to the cathode side of an arc power source or supply 5. The electrically conductive material 1 of the insulated and coated wire 3 is connected to the anode side of the arc power source 5. And at least the space between the insulated and coated wire 3 and the discharge torch 4 is in the environment of an inert gas.

Figure 2:
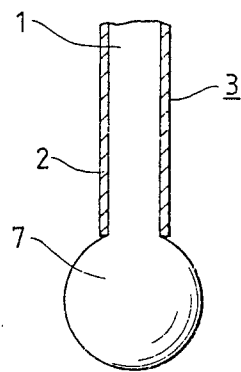
FIG. 2 is an elevational view of the ball formed by the method of FIG. 1.

In the means constituted as above described, when the arc power source 5 is turned on, the electrons of the arc 6 are concentrated at the tip 1a of the electrically conductive material 1, which electrons can reach along the shortest path. With this electron concentration, the insulated coating 2 is thermally decomposed, but the amount of the upward melting is at a minimum and. Furthermore, the melting of the tip 1a of the electrically conductive material 1 is stable, forming a truly spherical ball 7 as shown in FIG. 2. Accordingly no excessive length of exposed electrically conductive material 1 is produced, so that adjoining insulated and coated wires 3 make no shortcircuiting by mutual. The contact of the electrically conductive material to the surface of the electrode can be prevented as well. Further, because the insulated coating 2 near the tip 1a is thermally decomposed, it does not obstruct connection.

Figure 3:
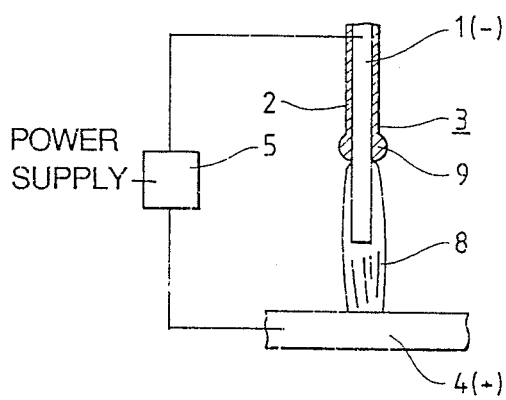
FIG. 3 is a schematic view showing the method of forming a ball with the electrode connection which is opposite to that in FIG. 1.
Figure 4:
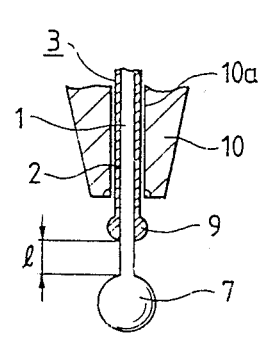
FIG. 4 is an elevational view of the ball formed by the method in FIG. 3.

When, as shown in FIG. 3, the discharge torch 4 is connected to the anode side of the arc power source 5 and the electrically conductive material 1 of the insulated and coated wire 3 is connected to the cathode side and an arc discharge is triggered, thermions are discharged from the insulated coating 2 in the initial stage of the arc discharge, and the arc 8 creeps up on the side opposite to the tip of the insulated coating and heat is given from the surface skin section. With this heat transfer the insulated coating 2 melts upwardly as shown in FIG. 4 l, exposing thereby a length of the electrically conductive material 1 corresponding to the length l. Further, at the end of the upward melting, a protrusion 9 develops. Accordingly not only the shortcircuiting among adjoining insulated coated wires 3 and the contact of the electrically conductive material 1 with the surface of the electrode occur, but also the throughhole 10a of the capillary 10 is closed by the protrusion 9, making the withdrawing of the insulated and coated wire impossible.

In the method of forming the ball according to the invention because the electrically conductive wire material 1 of the insulated and coated wire is connected to the anode side and the discharge torch 4 to the cathode side as described in the foregoing, the amount of the upward melting of the insulated coating 2 is almost none and, furthermore, a protrusion 9 is not formed.

The invention will be further explained by an embodiment described below.

Figure 8:
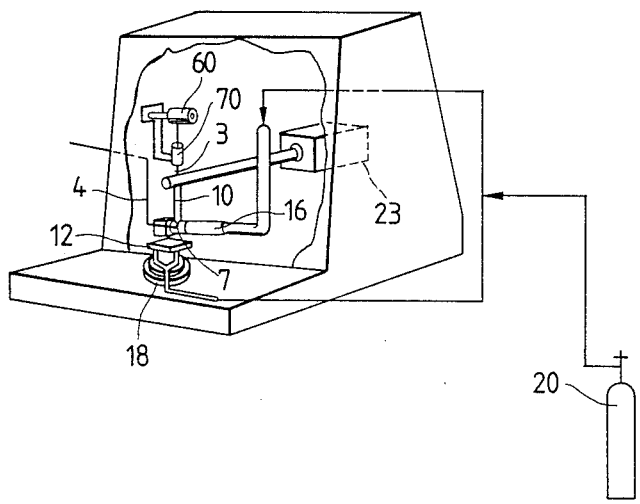
FIG. 8 is a perspective view showing the main portion of wire bonding means according to the invention.

In FIG. 8 an insulated and coated wire 3 is wound on a metal spool 60 and it is inserted into a capillary 10 through a paying-out roller 70. The capillary 10 is mounted to the tip of an ultrasonic vibrator 23. An inert gas such as argon is supplied from a gas cylinder 20 to a capsule 16 or an IC chip 12 on which a wiring is provided in order to prevent the oxidation of the ball during it formation. A discharge torch 4 is provided rotatably in order to form the ball 7 of the coated wire 3.

Figure 9:
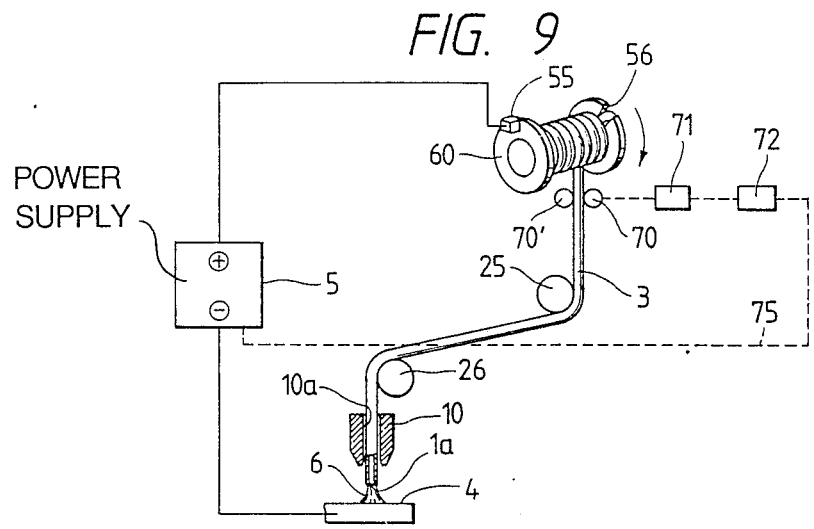
FIG. 9 is a perspective view of the outline of wire bonding means according to the invention.

In FIG. 9, 5 denotes an arc power source (details below), 4 denotes a discharge torch connected to the anode side of this arc power source 5, and 10 a capillary into the throughhole of which an insulated and coated wire 3 can be inserted withdrawably. This capillary 10 is mounted on the tip of the ultrasonic horn of an ultrasonic vibrator 23 in FIG. 8. Said ultrasonic vibrator 23 is mounted on an elevator mechanism (not shown) which is mounted and fixed on an X Y table (not shown), and by this elevator mechanism the capillary 10 can be moved up and down. And, by said X Y table the capillary 10 is moved in the X Y plane and the joint section of the insulated and coated wire 3 which is inserted into the throughhole 10a of the capillary 10 so that it can be positioned at a specified location of the joint.

Figure 10:
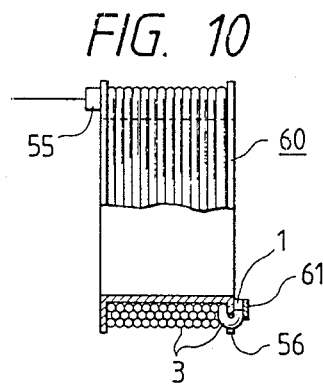
FIG. 10 is a partial cross section showing the detail of a metal spool in FIG. 9.

On the side of the other end, the insulated and coated wire 3 is wound on a metal spool 60 which is freely rotatable. As shown in detail in FIG. 10 the electrically conductive wire material 1 at the tip is connected to a notch section 56 provided on the metal spool 60 by means of a clamp 61. The insulated and coated wire 3 thus wound on the metal spool is successively paid out from via wire supply rollers 25 and 26.

Figure 11:
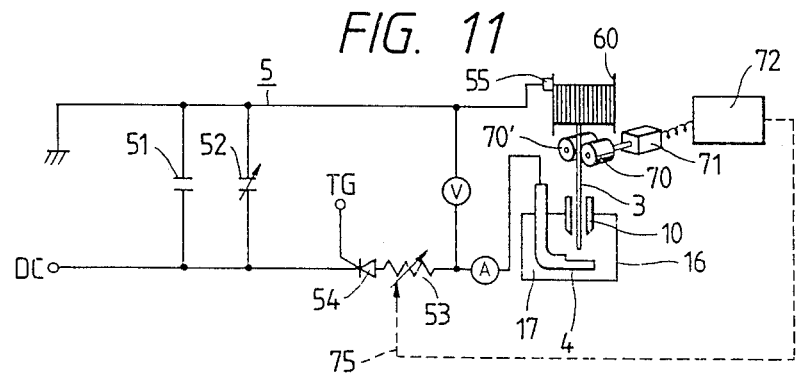
FIG. 11 is a circuit diagram showing the detail of the arc power source in FIG. 9.

Said arc power source 5, as shown in detail in FIG. 11, is provided with an electric charge accumulating capacitor 52 which is capable of charging a capacitor 51 and supplying a discharge current, a thyristor 54 which triggers electric charge accumulating condenser 52 and a variable resistor which is connected in series with the thyristor 54. 55 denotes a brush which is mounted on the anode side of the arc power source 50. This brush 55 is connected to the metal spool 60 in rotation.

Rollers 70 and 70' are for paying out wire, and 71 is a length measuring instrument which is mounted on the shaft of the paying-out roller 70 and measures the length of the insulated and coated wire 3 which has been paid out (or consumed). A subtraction counter is connected to the length measuring instrument 71. By means of this subtraction counter 72 the resistance value of said variable resistor 53 is changed with the length of the wound insulated and coated wire 3 which is left on the metal spool 60, and the voltage V applied by the arc power source 5 can be made as large as the value in the formula (1) below. Namely, $$V = V' + \Delta V = V' + C_o x \quad (1)$$
$$(X \leq L)$$

where, $V'$: Voltage between the discharge torch and the tip of the insulated and coated wire, $C_o$: constant, X : Length of the residual length of the insulated coated wire left on the metal spool.

L : Length of winding per one spool.

Figure 12:
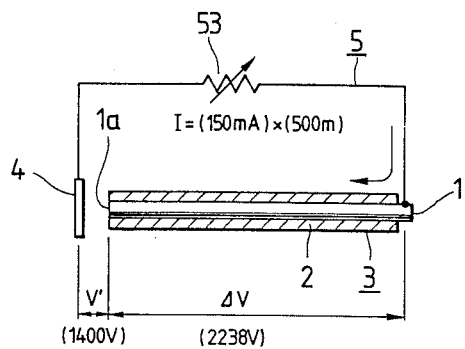
FIG. 12 is an applied voltage diagram to show schematically the applied voltage of the arc power source in the beginning of the use of an insulated and coated wire.
Figure 13:
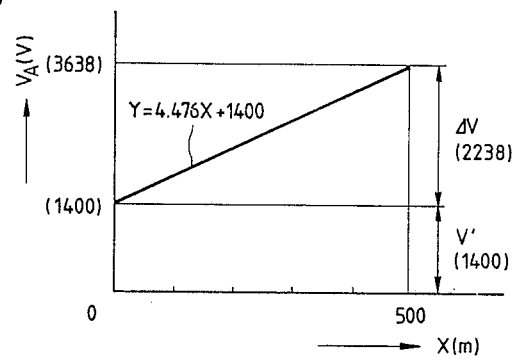
FIG. 13 is a voltage characteristic diagram showing the relation between the residual winding length of an insulated and coated wire and the applied voltage.

The reason for determining the voltage V of the arc power source 5 as in the above formula (1) will be explained with reference to FIG. 12 and FIG. 13.

According to the research done by the inventors of the present invention, if the electrically conductive wire material 1 of, for instance, 32 μm gold wire is taken, the current, I=150 mA is passed through the insulated and coated wire 3, the voltage $V'$=1400 volt is applied for the time interval of 0.1 ms between the discharge torch 4 and the tip 1a of the wire, and the ball which is formed in this time had no oxidation formed on its ball surface.

Now, in order to satisfy the above-mentioned conditions independently of the residual length x of the insulated and coated wire 3 left on the metal spool 60, the voltage V applied by the arc power source 5 should be lowered with the increase in the consumed length (L−x) of the insulated and coated wire 3 so as to satisfy the formula (1)' below:

$$V = V' + \Delta V = 1400 + 4.476 X \quad (1)'$$
$$(X \leq L)$$

where, L is the length of the wire on one spool, that is the length of the insulated and coated wire 3 at the beginning of using it, and L=500 m.

The linear relation between the residual length x of the wire on the spool and the applied voltage V as shown in (1)' holds regardless of the wire material used for the electrically conductive wire material 1 and its diameter except for changes in the term of the constant and the coefficient of X in the formula.

The embodiment of the invention which employs the wire bonding means as constituted above will be described below to explain the method of wire bonding for insulated and coated wires.

This embodiment provides the wiring between the IC chip 12 of an IC package (its details given below) on which the wiring is not yet provided and various lead wire sections with an insulated and coated wire 3.

Figure 5:
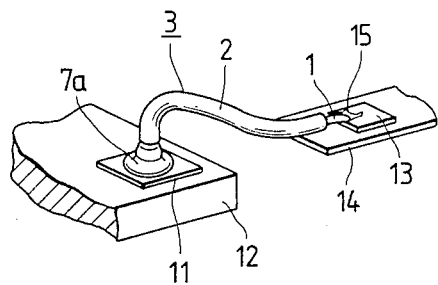
FIG. 5 is a perspective view of first and second bonding pads which are wired by the wire bonding method according to the present invention.

In reference to FIG. 5 said IC package with no wiring is provided with an IC chip 12 which has a first bonding pad 11 of an electrically conductive electrode, a third bonding pad 13, ..., a first lead section 14 with a second bonding pad 13 of an electrically conductive electrode, and a second lead section (not shown) with a fourth bonding pad (not shown) etc..

Firstly an insulated and coated wire 3 is wound on a metal spool 60, and the rear end tip of the wire 3 is stripped of its insulated coating 2 and the exposed electrically conductive wire 1 is connected to the notch section 56. The forward end tip of the wire 3 is inserted into the throughhole 10 of the capillary 10 via paying-out rollers 70 and 71 and supply rollers 25 and 26, and the tip 1a of the wire is made to protrude by a specified length from the capillary 10. At this time a brush 55 is in contact with a metal spool 60 and is electrically connected with the insulated and coated wire 3 through the arc 6.

At a specified position on a jig (not shown) said IC package without wiring is placed and fixed. Various lead sections of this package can be heated to a temperature such as 75° C. above the glass transition temperature of the insulated coating 2 of the insulated and coated wire 3 by a heater 18 in FIG. 8.

Figure 6:
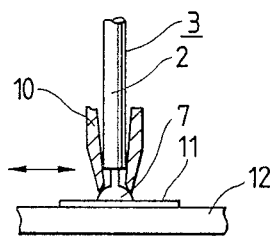
FIG. 6 is an elevational view showing the connection of the ball at the tip of an insulated and coated wire to the first bonding pad by the method in FIG. 5.
Figure 7:
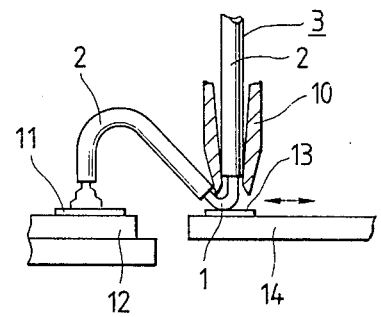
FIG. 7 is an elevational view showing the connection of an intermediate portion of an insulated and coated wire to the second bonding pad.

Here, when the wire bonding means is turned on, the above-mentioned heater 18 is on and all the lead sections are heated to a specified temperature. The wire tip 1a of the insulated and coated wire 3 is positioned by said X Y table and elevator mechanism at a position away from the discharge torch 4 by a specified distance. When the arc power source 5 is turned on (for instance, −3638 volt is applied to DC) a discharge is made between the electrically conductive wire material 1 and the discharge torch 4 for a time of 0.1 ms and a ball shown in FIG. 2 is formed. The ball 7 is positioned above the first bonding pad 11 of the IC chip 12 by said X Y table. Then a specified pressure is exerted on the ball 7 the position of which was fixed by the elevator mechanism. Then said ultrasonic vibrator 23 is turned on, and ultrasonic vibration (with, for instance, 60 KHz) is transmitted to the capillary 10, and a ball 7 vibrates (with, for instance, the amplitude of 1 μm) in the direction of the arrow mark as shown in FIG. 6. Then the ball 7 becomes a ball compression section 7a and is connected to the first bonding pad 11, turning off said ultrasonic vibrator 23. The capillary 10 ascends, paying out the insulated and coated wire 3 from the metal spool 60 and then the capillary 10 descends again to position a specified intermediate section of said wire 3 over the second bonding pad 13 of the first lead section 14. Then a specified pressure is applied to the intermediate section which has been positioned by said elevator mechanism. Further, said wire 3 is heated from the first lead section 14 through the second bonding pad 13, making the insulated coating 2 fluidized. Again said ultrasonic vibrator 23 is turned on and ultrasonic vibration is transmitted to the intermediate section, and, as shown in FIG. 7, said intermediate section vibrates in the direction of the arrow mark, and the wedge section 15 which is formed by having the portion of the electrically conductive wire stripped of its coating is connected to the second bonding pad 13. Next, when the capillary 10 ascends by the elevator mechanism, the insulated and coated wire 3 is subject to tension, and the insulated and coated wire is cut at the end of the wedge section 15. With this arrangement both first bonding pad 11 and second bonding pad 13 are wired with the insulated and coated wire 3. The capillary 10 further moves, and the tip of the insulated and coated wire 3, that is the tip 1a of the wire 3 is positioned to a position which is away from the discharge torch 4 by a specified distance. Then, the arc power source 5 is turned on (at this time the voltage applied to DC is lowered according to the consumed length of the insulated and coated wire 3, and it may be, for instance, −3628 V.), and an arc discharge is made in a time of 0.1 ms, and the same ball 7 as the one described above is formed.

Figure 14:
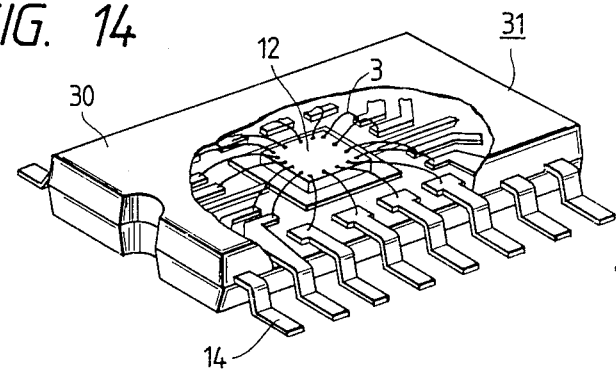
FIG. 14 is a perspective view within partial cross-section view of a resin sealed product which seals with resin an IC package connected by the invention.

The same actions as the foregoing are repeated, and, for instance, a third bonding pad and fourth bonding pad are wired. When all connections are finished, said wire bonding means is turned off, and said IC package with no wiring is provided with wiring. Then, it is sealed by resin 30 to provide a desired resin-sealed product 31 as shown in FIG. 14.

According to the embodiment above explained, in the first bonding, third bonding, . . . there is no upward melting of the insulated coating 2 and the ball 7 that has no oxide on its surface is formed. This ball 7 is connected to the first bonding pad 11, third bonding pad, etc. and at the second bonding pad, fourth bonding pad, . . . only the intermediate sections of the insulated coating 2 which become the wedge section 15 are turned into a fluid sate by the heating from lead sections, and the electrically conductive wires 1 at those intermediate sections are connected to the second bonding pad 13, fourth bonding pad, etc. With this method the disadvantages in the prior art such as developing the leakage current caused by the contact of an exposed electrically conductive wire 1 of the insulated and coated wire 3 with the upper end of the outer periphery of an IC chip, short circuiting among crossing electrically conductive wires portions of the insulated and coated wire 3, faulty connections due to the attachment of the molten insulated coating to bonding pads, etc. can be avoided, and, further, it is possible to connect the insulated and coated wire 3 to bonding pads 11, 13 . . . with reliability and easiness.

The electricity supply from the arc power source 5 to the insulated and coated wire 3 is not provided by the removal of the insulated coating 2 at an intermediate section of a wire nor by piercing a needle-like probe through the insulated coating 2, but is provided by the removal of the insulated coating 2 at the end of the insulated and coated wire 3, connection of the electrically conductive wire material 1 to a metal spool 60 and supplying of electric current through the spool 60. This method allows us to use the whole length of the insulated and coated wire 3 with the result that the use does not involve loss.

In this embodiment of the present invention, the wire bonding method utilizes an insulated and coated wire 3 consisting of an electrically conductive wire 1 of gold with an insulated coating 2 of polyurethane, but aluminum and copper, for instance, can be used in place of gold as an electrically conductive material and polyesther, polyamid, and other materials can be used for the insulated coating in the wire bonding of the invention.

In this embodiment, argon 17 is sealed in the capsule 16, but other gases such as nitrogen gas which are inert and do not produce an oxide on the ball which gives an ill effect to the connection during the arc discharge from the insulated and coated wire 3 and which can remove the insulated coating 2 by thermal decomposition can be used for sealing the capsule 16.

Further, in this embodiment a brush 55 is rotation but any electrically conductive member used for the contact with an object in motion is allowed.

Figure 15:
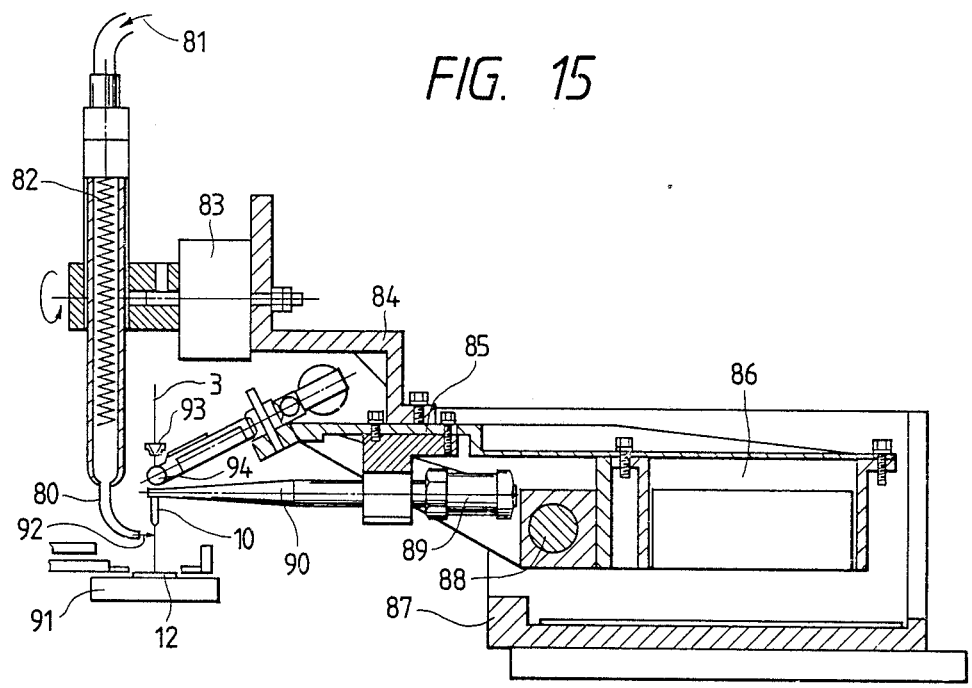
FIG. 15 is a longitudinal cross-sectional view of bonding means as another embodiment of the invention.

Next, in FIG. 15 another embodiment of means for wire bonding according to the invention will be explained. 80 denotes a hot air nozzle, and gases such as air which are conveyed under pressure are heated by an incorporated heater 82 to a specified temperature and then jetted out. This hot air nozzle 80 can be swayed with respect to the coated wire 3 by a rotary actuator 83 which is a drive device. The rotary actuator 83 is mounted through a bracket 84 on a bonding head 85 which is swayed in the up and down directions (the direction of X axis) with a shaft 88 as the fulcrum by means of a linear motor 86 which is installed on a base 87 for instance. A bonding tool 90 which is connected to an ultrasonic vibrator 89 is fixed to the bonding head 85 and a capillary 10 which is mounted on the tip of the bonding tool 90 moves up and down with respect to an IC chip 12 which is placed on a stage 91. The coated wire 3 is led to the capillary 10 through the inside of a wire guide 93 and wire clamp 94 on the bonding head 85. FIG. 15 shows the coated wire 3 is erect after it has pierced through the capillary 10 and bonded to the first bonding of the IC chip 12 and the second bonding connection section of the erect coated wire 3 is being hit by the hot air jetted from a hot air nozzle 80.

Figure 16:
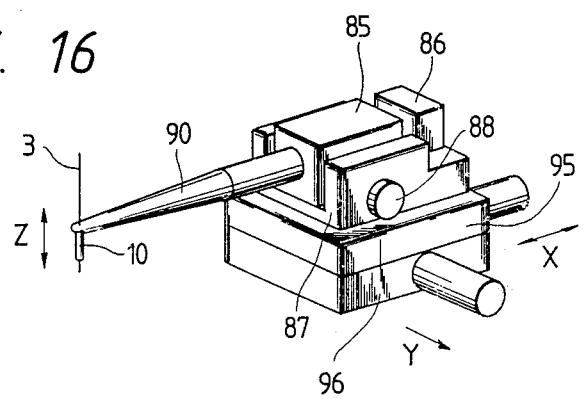
FIG. 16 is a schematic view to show the bonding section in FIG. 15 which is mounted on the X Y table.

In FIG. 16 a bonding section which includes a bonding head 85, linear motor 86, and base 87 is mounted on the X table 95 and Y table 96, and FIG. 16 shows that the bonding tool 90 can be moved to any position in the X Y coordinates.

FIG. 17 shows the work processes of the bonding of a coated wire as explained in the above embodiments.

In FIG. 17(a), the first bonding process is shown in which the capillary 10 descends and the coated wire 3 is connected to the bonding pad 11 on the IC chip by the ball compression section 7a of the coated wire 3. At this time the hot air nozzle 80 is standing by at the side position in which it does not interfere with the capillary 10.

In FIG. 17(b), the capillary 10 has ascended after the first bonding is finished and the hot air nozzle is still standing by.

In FIG. 17(c), the capillary 10 is stopped at a height that corresponds to a specified length of a wiring and the coated wire 3 is clamped by a wire clamp 94. The hot air nozzle 80 is moved to a position opposite to the second bonding section 1b and the coating at the second bonding connection section 1b and its periphery is removed.

In FIG. 17(d), the coating has been removed, the hot air nozzle 80 has retreated, and the capillary 10 has descended and stopped at the second bonding connection section 1b, and the coated wire 3 is held by the wire clamp 94.

In FIG. 17(e), the capillary 10 is further lowered with the coated wire 3 clamped, and at the same time the X Y tables 95 and 96 shown in FIG. 16 are moved to make a loop in the wiring.

In FIG. 17(f), the X Y tables are stopped, the coated wire 3 is held, and at the same time the second bonding connection section 1b is compressed by the capillary 10 to which the ultrasonic waves are applied and the coated wire 3 is welded by ultrasonic welding to the bonding pad 13 on the side of the lead.

Because the hot air nozzle 80 is mounted on the bonding head 85 as shown in FIG. 15, it is possible to remove the coating at a specified height of the wiring by giving a signal to the linear motor 86 according to the length of the wiring to be connected.

According to the present invention described in detail in the foregoing embodiments, the disadvantages in the prior art such as current leakage from a coated wire to an electrode surface, shortcircuiting among insulated and coated wires, and melting of the coating material to obstruct connections are eliminated, and the invention presents a wire bonding method in which it is possible to positively and easily connect an insulated and coated wire to an electrically conductive electrode, and also to use the insulated and coated wire without making any waste in material.

Furthermore, according to the invention after the first bonding is finished, the coating is removed by jetting hot air to the coating located at the second bonding connection section of the standing coated wire and the coating adjoining the second bonding section, and the second bonding connection section which is stripped of its coating is bonded by the ultrasonic welding so that the connection of the second bonding connection section is not obstructed as in the prior art by the melted coating material and reliable connection can be achieved. By the present invention it becomes possible to use insulated and coated wires in the internal wiring of an IC chip, and despite ever increasingly higher mounting density of the IC construction, it is possible to avoid the trouble of a leakage current caused by the contact of the internal wiring with the outer peripheral edges of the IC chip and to avoid short-circuiting when the wires cross each other.

What is claimed is:

1. A method of bonding an insulated and coated wire which has an insulated coating on the outside of an electrically conductive wire, comprising:

connecting one end of said insulated and coated wire to an anode side of an arc power source and connecting a discharge torch to a cathode side of said arc power source, generating an arc discharge between the other end of said insulated and coated wire and said discharge torch to form a ball on said one end;

positioning said ball with respect to a bonding pad of an electrically conductive electrode and bonding said ball to said bonding pad by applying a specified pressure to said ball; and supplying said insulated and coated wire by unwinding it from a freely rotatable grounded metal spool and electrically connecting a conductive wire portion of said insulated and coated wire at said one end to said metal spool, and said arc power source generating and applying a voltage which decreases in proportion to a winding length of said insulated and coated wire left on the metal spool, and connecting the anode side of said arc power source to said metal spool in rotation with said metal spool, and connecting the cathode side to said discharge torch.

2. A method of wire-bonding an insulated and coated wire, comprising:

providing an insulated and coated wire having an insulated coating on an electrically conductive wire and inserting it withdrawably into a throughhole of a capillary for holding said insulated wire, positioning the tip of said insulated and coated wire to a predetermined position with respect to a first bonding pad by means of said capillary and connecting said tip to said first bonding pad (first bonding), positioning an intermediate section of said insulated and coated wire with respect to a second bonding pad by means of said capillary and connecting said tip to said second bonding pad (second bonding), cutting said insulated and coated wire off from said second bonding pad by exerting a pulling force to said insulated and coated wire at the side of the other end thereof whereby a wiring between said first bonding pad and said second bonding pad is provided by said insulated and coated wire, connecting the electrically conductive wire of said insulated and coated wire and a discharge torch respectively to the anode side and cathode side of an arc power source, generating an arc discharge in the environment of an inert gas to form a ball on the tip of said insulated and coated wire, positioning said ball with respect to said first bonding pad by said capillary and at the same time subjecting said ball to ultrasonic vibration and exerting a specified pressure to said ball whereby said first bonding is provided, and positioning an intermediate section of said insulated and coated wire by said capillary with respect to said second bonding pad and heating said intermediate section to a temperature above the glass transition temperature of said coating of said wire and at the same time subjecting said intermediate section to ultrasonic vibration as a specified pressure is exerted on said intermediate section whereby said second bonding is provided.

3. A method of wire-bonding an insulated and coated wire, comprising:

inserting the side of one end of an insulated and coated wire which has an insulated coating on the outside of an electrically conductive wire withdrawably into the throughhole of a capillary, generating an arc discharge using an arc power source between the end of said insulated and coated wire and a discharge torch to form a ball on said end, positioning said ball with respect to said bonding pad by said capillary and at the same time subjecting said ball to ultrasonic vibration with a specified pressure exerted on said ball, whereby a bonding is provided between said ball and said bonding pad, providing said insulated and coated wire wound on a freely rotatable metal spool, connecting the electrically conductive wire at the end of said insulated and coated wire to said metal spool, providing said arc power source as an arc power source capable of applying a voltage which decreases in proportion to the winding length of said insulated and coated wire left on said metal spool, and connecting the anode side of said arc power source to said metal spool in rotation, grounding said metal spool, and connecting the cathode side of said metal spool to said discharge torch.

4. A bonding apparatus for an insulated and coated wire which has insulated coating on the outside of an electrically conductive wire, comprising:

an arc power source having its anode side connected to said electrically conductive wire;

a discharge torch connected to the cathode side of said arc power source so that an arc discharge is generated between the tip end of said electrically conductive wire and said discharge torch to form a ball on said tip end;

means for positioning said ball of said wire to a bonding pad of an electrically conductive electrode and means for bonding said ball to said bonding pad; and a hot air nozzle for removing said coating on the electrically conductive wire, means for driving said hot air nozzle to a position opposite to a second bonding connection section of said coated wire to remove said coating and its peripheral sections after said first bonding, capillary means for receiving said coated wire, means for applying pressure to said second bonding section through said capillary, and means for applying ultrasonic vibration to a second bonding path for welding said second bonding section with said coating removed to said second bonding pad.

* * * * *